March 8, 1960 P. W. KRUSE 2,928,006

RADIATION AMPLIFIER

Filed Sept. 27, 1957

INVENTOR.
PAUL W. KRUSE

BY Gust & Irish

ATTORNEYS

United States Patent Office 2,928,006

Patented Mar. 8, 1960

2,928,006

RADIATION AMPLIFIER

Paul W. Kruse, Virginia, Minn., assignor to International Telephone and Telegraph Corporation Application September 27, 1957, Serial No. 686,787

6 Claims. (Cl. 250—213)

This invention relates to radiation amplifiers, and more particularly to solid-state, direct viewing radiation amplifiers for reproducing and intensifying a given radiation image.

Certain materials may be excited to luminescence by the application thereto of a suitable electric field; such materials are referred to as "electroluminescent" and may, for example, be a copper-activated zinc oxide and zinc sulfide mixture as explained by Destriau in the 1937 edition, volume 38, of the Philosophical Magazine, pages 700–739, 774–793, and 800–887. Other suitable materials are also described in Patent Numbers 2,566,349 and 2,624,857. Radiation amplifier devices utilizing such electroluminescent materials have been proposed in the past, for example, as described and illustrated in Orthuber continuation-in-part application of Serial No. 332,733, filed January 22, 1953, and assigned to the assignee of the present application. Such radiation amplifiers conventionally were of laminated construction in which the laminae, for all practical purposes, were arranged in the manner of an ordinary parallel-plate condenser having dielectric material disposed between the two plates. In this arrangement, the plates of the condenser were composed of electrically conductive material, such as thin transparent films with the dielectric material being in turn formed in two layers, or laminae, i.e., a lamination of photoconductive material, such as cadmium sulfide, having high, dark electrical impedance, and a contiguous lamination of electroluminescent phosphor material. A suitable voltage was impressed across the outer conductive layers and with no light impinging on the device, the resistance of the photoconductive layer was sufficiently high so that an inadequate voltage was available for exciting the electroluminescent layer to luminesce. However, with increasing light impinging upon the device, the resistance of the photoconductive layer decreased, thus impressing a greater voltage across the electroluminescent layer causing it to luminesce with increasing brilliance.

Previous solid-state radiation amplifiers of the type described above, which are known to the applicant, have required that the image to be amplified be projected upon the device from one side and that the resulting intensified image be viewed from the other side; this limitation has precluded mounting of the radiation amplifier device directly upon a flat wall for use, for example, in intensifying and direct viewing of a television picture projected from a small television picture tube through an optical system.

It is therefore desirable to provide a solid-state radiation amplifier of the general type described above, which may, however, have the image projected upon and the device viewed from the same side, thereby permitting the device to be mounted upon a flat wall.

I have found that a solid-state radiation amplifier device which can be viewed from the same side as the image is projected upon may be constructed by providing a body of photoconductive material, preferably in sheet form, with at least two spaced-apart parallel strips of conductive material imbedded in one surface thereof. A strip of electroluminescent material is also imbedded in the surface of the sheet of photoconductive material abutting one of the conductive strips and spaced from the other, thereby defining a strip of photoconductive material. The conductive strips are connected across a source of alternating current, thereby providing a series circuit between the conductor strips, the electroluminescent strip and the photoconductive strip, this series circuit being normal to the incident radiation rather than parallel therewith as in the prior devices known to the applicant. With such an arrangement, the projected image may impinge upon and the resulting luminescent image viewed from the same surface of the device, i.e., the surface in which the conductive and electroluminescent strips are imbedded.

It is therefore an object of this invention to provide an improved solid-state radiation amplifier.

Another object of this invention is to provide an improved solid-state radiation amplifier in which the incident radiation is projected upon and the resulting luminescence viewed from the same side.

The above mentioned and other features and objects of this invention and the manner of attaining them will become more apparent and the invention itself will be best understood by reference to the following description of an embodiment of the invention taken in conjunction with the accompanying drawings, wherein.

Figure 1:
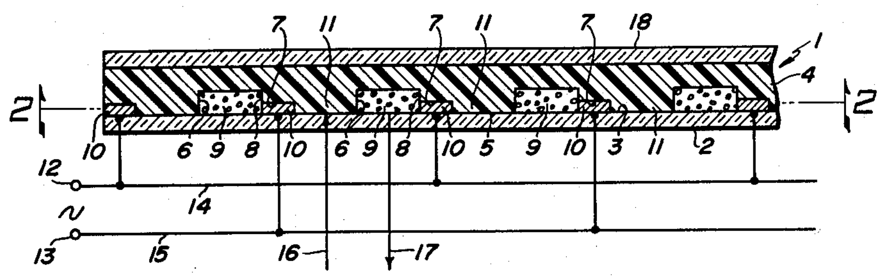
Fig. 1 is a cross-sectional view showing an embodiment of the improved solid-state radiation amplifier of my invention.
Figure 2:
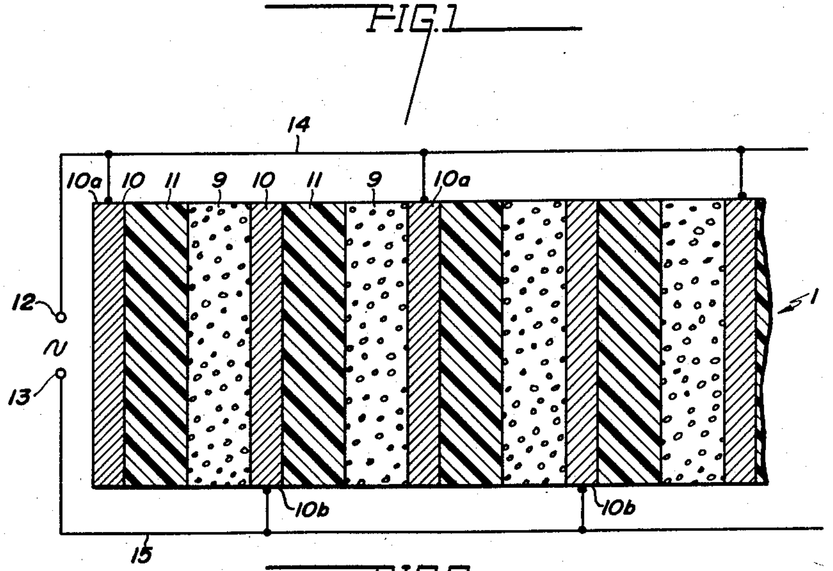
Fig. 2 is a cross-sectional view taken along the line 2—2 of Fig. 1.

Referring now to Figs. 1 and 2, my solid-state radiation amplifier, generally identified as 1, is in relatively thin panel-form and includes a relatively thin supporting plate 2 formed of transparent material, such as glass or transparent plastic. Abutting the inner surface 3 of the supporting plate 1 is a sheet 4 formed of photoconductive material, for example, cadmium sulfide. The surface 5 of the photoconductive sheet 4 contiguous with the inner surface 3 of supporting plate 2 has a plurality of relatively deep and wide, spaced-apart grooves 6 formed therein. The surface 5 of photoconductive sheet 4 also has a plurality of relatively shallow and narrow spaced-apart grooves 7 formed therein respectively communicating with the sides 8 of grooves 6. Strips 9 of electroluminescent phosphor material are disposed in the grooves 6 and strips 10 of conductive material, for example, copper, are disposed in the grooves 7. Reference to Fig. 2 will now show that each electroluminescent strip 9 defines, with a conductive strip 10 which is remote from the adjacent conductive strip 10, a strip 11 of photoconductive material.

The conductive strips 10 are interdigitally connected to input terminals 12 and 13, i.e., the alternate conductive strips 10*a* are connected to input terminal 12 by means of electrical leads 14, while the alternate conductive strips 10*b* intermediate strips 10*a* are connected to input terminal 13 by means of electrical leads 15. Input terminals 12 and 13 are adapted to be connected to an external source (not shown) of alternating current of suitable voltage and frequency, i.e., for example, 1,000 cycles, 500 volts. It will now be seen that there is provided across the surface 5 of the photoconductive sheet 4 a plurality of series circuits, each series circuit including a pair of conductive strips 10 with the intermediate electroluminescent strip 9 and photoconductive strip 11, these series circuits being respectively connected across the alternating current input terminals 12 and 13.

Figure 4:
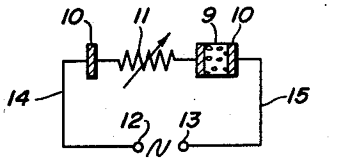
Fig. 4 is a schematic diagram showing the equivalent electrical circuit of the radiation amplifier of this invention.

Referring now to Fig. 4, the conductive strips 10 are shown as plates with the photoconductive material 11 being represented as a variable resistance and with the electroluminescent material 9 being represented as the dielectric material of a condenser. It will readily be seen that when a source of alternating current is connected across terminals 12 and 13, the voltage of that source will be impressed across conductive strips or plates 10 and will divide between the photoconductive material or resistor 11 and the electroluminescent material or capacitor 9 in proportion to their relative impedances, i.e., the photoconductive material 11 and electroluminescent material 9 form a voltage divider circuit. It will now be recalled that the photoconductive material 11 has high, dark resistance and thus, with no light impinging upon the photoconductive material, its impedance will be relatively high compared with the impedance of the electroluminescent material 9 and thus, a relatively small proportion of the total available voltage across terminals 12 and 13 will be impressed across the electroluminescent material 9. Now, assuming that light impinges upon the photoconductive material 11, its impedance will be lowered, thus lowering its voltage drop and in turn increasing the voltage applied to the electroluminescent material 9. This voltage will cause the electroluminescent material 9 to luminesce, the brilliance of the luminescence being dependent upon the voltage appearing thereacross. It is thus seen that light impinging upon the photoconductive material 11 will cause luminescence of the photoconductive material 9, the brilliance of the luminescence being dependent upon the amount of light impinging upon the photoconductive material 11. Thus, an optical image impressed upon a plurality of series circuits as shown in Fig. 4, such image having relatively light and dark areas, will result in luminescence of the corresponding electroluminescent elements 9 thereby to provide an image corresponding to the projected image; with proper proportioning of the components, the resulting luminescent image may be substantially brighter than the projected image.

Returning now to Fig. 1, it will be seen that with light impinging upon the radiation amplifier 1, as shown by the arrow 16, the series circuits formed of the conductive strips 10, photoconductive strips 11 and electroluminescent strips 9 are normal to the impingement of the light 16. Further, since the electroluminescent strips 9 are disposed in the same plane as the photoconductive strips 11, the resulting displayed image may be viewed on the same side of the panel 1 as the projected image, as shown by the arrow 17.

For mechanical reasons of support, it may be desirable to provide another supporting plate 18 on the other side of the photoconductive sheet 4; this second supporting plate 18 will preferably be formed of opaque material or be covered with a layer of opaque material in order to prevent the entry of extraneous light from the back side of the panel 1 thereby distorting the projected image 16. It may also be found desirable to interpose light-attenuating or opaque material between the electroluminescent strips 9 and the surrounding photoconductive material in order to prevent light feed-back.

It will readily be seen that the portion of the photoconductive material which is included in the conductive material-photoconductive material-electroluminescent material series circuit is limited to a thin strip 11 adjacent supporting plate 2 and that this low resistance path will effectively short out the bulk of the remaining photoconductive material. In my improved arrangement, therefore, I make the maximum and most efficient use of the incident radiation and my device, therefore, provides improved sensitivity with respect to prior devices in which the incident radiation must penetrate the entire layer of photoconductive material. It will also be seen that my improved radiation amplifier panel can be supported in intimate contact with a flat wall since the projected image impinges on and the viewed image emanates from the same side of the panel. Thus, my improved radiation amplifier lends itself to projection television since the picture displayed on a small cathode ray tube can be enlarged and projected upon the transparent supporting plate 2 by a suitable optical system with the resulting intensified image being displayed for optical viewing on the same surface.

Figure 3:
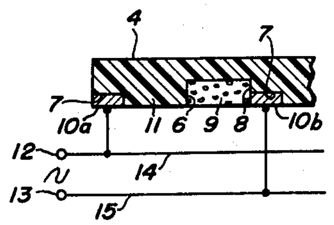
Fig. 3 is a cross-sectional view showing another embodiment of this invention.

It may be found possible to eliminate the supporting plates 2 and 18 to provide a device as shown in Fig. 3 in which like elements are indicated by like reference numerals.

While I have described above the principles of my invention in connection with specific apparatus, it is to be clearly understood that this description is made only by way of example and not as a limitation to the scope of my invention.

What is claimed is:

1. A solid state radiation amplifier comprising: at least two spaced-apart parallel strips of conductive material; at least one strip of electroluminescent material intermediate said conductive strips and abutting one of said conductive strips and spaced from the other; a strip of material having impedance characteristics which vary in response to variations in radiation incident thereto respectively abutting said electroluminescent strip and the other of said conductive strips; and electrical connection for respectively connecting said conductive strips across a source of alternating current thereby connecting said conductive strip and said electroluminescent and variable impedance material strips in a series circuit across said source with said series circuit being normal to the incident radiation whereby said radiation may be projected upon and said electroluminescent material produces luminescence on the same side of said amplifier.

2. A solid state radiation amplifier comprising: a sheet formed of material having impedance characteristics which vary in response to variations in radiation incident thereto; at least two spaced-apart parallel strips of conductive material imbedded in one surface of said sheet; a strip of electroluminescent material imbedded in said one surface abutting one of said conductive strips and spaced from the other of said conductive strips thereby defining a strip of said variable impedance material; and electrical connection for respectively connecting said conductive strips across a source of alternating current thereby connecting said conductive strips and said electroluminescent and variable impedance material strips in a series circuit across said source with said series circuit being normal to the incident radiation whereby said radiation may be projected upon and said electroluminescent material produces luminescence on said one surface of said sheet.

3. A solid state radiation amplifier comprising: a sheet formed of material having impedance characteristics which vary in response to variations in radiation incident thereto; at least two spaced-apart parallel strips of conductive material imbedded in one surface of said sheet and flush therewith; a strip of electroluminescent material imbedded in said one surface and flush therewith, said electroluminescent strip abutting one of said conductive strips and being spaced from the other of said conductive strips thereby defining a strip of said variable impedance material; and electrical connections for respectively connecting said conductive strips across a source of alternating current thereby connecting said conductive strips and said electroluminescent and variable impedance material strips in a series circuit across said source with said series circuit being normal to the incident radiation whereby said radiation may be projected upon and said electroluminescent material produces luminescence on said one surface of said sheet.

4. A solid state radiation amplifier comprising: a relatively thin sheet formed of photoconductive material; at least two spaced apart parallel strips of conductive material imbedded in one surface of said sheet; a strip of electroluminescent material imbedded on said one surface abutting one of said conductive strips and spaced from the other of said conductive strips thereby defining a strip of said photoconductive material; and electrical connections for respectively connecting said conductive strips across a source of alternating current thereby connecting said conductive strips and said electroluminescent and photoconductive material strips in a series circuit across said source with said series circuit being normal to the incident radiation whereby said radiation may be projected upon and said electroluminescent material produces luminescence on said one surface of said sheet.

5. A solid state radiation amplifier comprising: a sheet formed of material having impedance characteristics which vary in response to variations in radiation incident thereto, said sheet having a plurality of spaced-apart paralel grooves formed in one surface thereof; a strip of electroluminescent material disposed in each of said grooves; a strip of conductive material disposed in each of said grooves abutting a side of the respective strips of electroluminescent material and spaced from the strip of electroluminescent material in the adjacent groove by a strip of said sheet material; and electrical connections for interdigitally connecting said conductive strips to a source of alternating current thereby connecting adjacent conductive strips and the respectively intermediate electroluminescent strips and sheet material strips in series circuits respectively across said source with said series circuits being normal to the incident radiation whereby said radiation is incident to and said electroluminescent material produces luminescence on the same surface of said sheet.

6. A solid state radiation amplifier comprising: a relatively thin sheet of photoconductive material having a plurality of parallel, spaced apart, relatively wide and deep grooves formed in one surface thereof; said sheet further having a plurality of parallel, spaced apart, relatively shallow and narrow grooves formed in said one surface, each of said shallow grooves communicating with one side of a respective deep groove; a strip of electroluminescent material filling each of said deep grooves and flush with said one surface of said sheet; a strip of conductive material filling each of said shallow grooves flush with said one surface of said sheet and electrically contacting the respective electroluminescent strips; each of said electroluminescent strips defining a strip of photoconductive material adjacent said one surface of said sheet with the strip of photoconductive material remote from its adjacent strip; and electrical connections for interdigitally connecting said conductive strips to a source of alternating current thereby connecting adjacent conductive strip and the respectively intermediate electroluminescent and photoconductive material strips in series circuits respectively across said source with said series circuits being adjacent to said one surface of said sheet and normal to the radiation incident thereto whereby said radiation is incident to and said electroluminescent material produces luminescence on said one surface of said sheet.

References Cited in the file of this patent

UNITED STATES PATENTS 2,768,310 Kazan et al. ------------ Oct. 23, 1956